United States Patent
Ahn et al.

(10) Patent No.: US 10,161,061 B2
(45) Date of Patent: Dec. 25, 2018

(54) POTASSIUM SODIUM NIOBATE CERAMICS WITH SINGLE CRYSTAL

(71) Applicant: KOREA INSTITUTE OF MACHINERY AND MATERIALS, Daejeon (KR)

(72) Inventors: Cheol-Woo Ahn, Changwon-si (KR); Jung-Ho Ryu, Changwon-si (KR); Byung-Dong Hahn, Changwon-si (KR)

(73) Assignee: KOREA INSTITUTE OF MACHINERY AND MATERIALS, Daejeon (KR)

( * ) Notice: Subject to any disclaimer, the term of this patent is extended or adjusted under 35 U.S.C. 154(b) by 119 days.

(21) Appl. No.: 15/260,320

(22) Filed: Sep. 9, 2016

(65) Prior Publication Data

US 2017/0356101 A1    Dec. 14, 2017

(30) Foreign Application Priority Data

Jun. 10, 2016 (KR) .................. 10-2016-0072717
Jun. 22, 2016 (KR) .................. 10-2016-0077956

(51) Int. Cl.

| | |
|---|---|
| *H01L 41/18* | (2006.01) |
| *C30B 29/30* | (2006.01) |
| *C30B 29/22* | (2006.01) |
| *C30B 1/04* | (2006.01) |

(Continued)

(52) U.S. Cl.
CPC ............. *C30B 29/22* (2013.01); *C04B 35/495* (2013.01); *C30B 1/04* (2013.01); *H01L 41/187* (2013.01); *H01L 41/1871* (2013.01); *H01L 41/1873* (2013.01); *C04B 2235/3201* (2013.01); *C04B 2235/3208* (2013.01);
(Continued)

(58) Field of Classification Search
CPC ............... H01L 41/187; H01L 41/1871; H01L 41/1873; C30B 29/30
See application file for complete search history.

(56) References Cited

U.S. PATENT DOCUMENTS

2011/0006643 A1\*   1/2011   Shibata ................. H01L 41/094
                                                                      310/357

FOREIGN PATENT DOCUMENTS

| KR | 19970061826 | \* | 9/1997 |
| WO | WO2011146020 | \* | 11/2011 |

OTHER PUBLICATIONS

Taub. Phase structure and piezoelectric properties of Ca- and Ba-doped K1/2Na1/2NbO3 lead-free ceramics. Ceramics International 39 (2013) 3555-3561.\*

(Continued)

*Primary Examiner* — Matthew E. Hoban
(74) *Attorney, Agent, or Firm* — Hauptman Ham, LLP (57) ABSTRACT

Disclosed is a (K,Na)NbO$_3$ (abbreviated by "KNN")-based single crystal ceramic. The KNN-based single crystal ceramic according to the present disclosure is formulated by $(K_{0.5-x/2}Na_{0.5-x/2-y}\square_{y/2}M_{x+y/2})Nb_{1-x/3+y}O_3$, wherein M indicates a metal having a different valence from Na, and $\square$ indicates a metal vacancy. The above formulated KNN-based single crystal ceramic allows compensating for the volatilization of Na in a growing grain due to the addition of $M^{2+}$ ions, and substituting $M^{2+}$ ions for $Na^+$ ions to form metal vacancies, thereby making possible the single crystal growth.

6 Claims, 10 Drawing Sheets

(51) Int. Cl.
C04B 35/495 (2006.01)
H01L 41/187 (2006.01)
(52) U.S. Cl.
CPC .......... C04B 2235/3215 (2013.01); C04B 2235/3255 (2013.01); C04B 2235/3282 (2013.01)

(56) References Cited

OTHER PUBLICATIONS

Korean Notice of Allowance dated Mar. 27, 2018 for corresponding to Korean application No. 10-2016-0077956. (Year: 2018).*
Cheol-Woo Ahn et al., "Composition Design Rule for High Piezoelectric Voltage Coefficient in (K0.5Na0.5)NbO3 Based Pb-Free Ceramics", Japanese Journal of Applied Physics 51 (2012), 5 pages.
Muhammad Asif Rafiq et al., "Ferroelectric domain studies of KNN single crystals by Piezo-force and transmission electron microscopy", Microsc. Microanal. 18 (Suppl 5), 2012, pp. 113-114.
Korean Office Action dated Jun. 16, 2017 corresponding to Korean Application No. KR 10-2016-0072717.
Xiaonong Shen et al., Photorefractive properties of Cu-doped KNSBN crystal with Li replacement at A-sites, Journal of Materials Science Letters 19, 2000, p. 1347-1350.
Korean Office Action dated Mar. 27, 2018 for corresponding to Korean application No. 10-2016-0072717.
[Supportive Materials for Exception to Loss of Novelty] Cheol-Woo AHN et al., "Composition Design and Single Crystal in (K, Na)NbO3-based Piezoelectric Ceramics", 1st International Symposium on Emerging Functional Materials, Announced on Nov. 5, 2015, 2015 Fall Meeting of the Korean Ceramic Society, 81 pages.
[Supportive Materials for Exception to Loss of Novelty] Cheol-Woo Ahn et al., "Self-Growth of Centimeter-Scale Single Crystals by Normal Sintering Process in Modified Potassium Sodium Niobate Ceramics", Scientific Reports 5:17656, Published on Dec. 3, 2015, 8 pages.

* cited by examiner

(K$_{0.5-0.015/2}$Na$_{0.5-0.015/2-0.1}$□$_{0.1/2}$Ba$_{0.015+0.1/2}$)Nb$_{1-0.015/3+0.1}$O$_3$
1125°C, 10 h sintering (K$_{0.5-0.015/2}$Na$_{0.5-0.015/2-0.1}$□$_{0.1/2}$Ba$_{0.015+0.1/2}$)Nb$_{1-0.015/3+0.1}$O$_3$
+ 0.1 wt% CuO
1090°C, 2 h sintering (K$_{0.5-0.015/2}$Na$_{0.5-0.015/2-0.1}$□$_{0.1/2}$Sr$_{0.015+0.1/2}$)Nb$_{1-0.015/3+0.1}$O$_3$
1125°C, 2 h sintering (K$_{0.5-0.015/2}$Na$_{0.5-0.015/2-0.1}$□$_{0.1/2}$Ca$_{0.015+0.1/2}$)Nb$_{1-0.015/3+0.1}$O$_3$
1125°C, 2 h sintering

POTASSIUM SODIUM NIOBATE CERAMICS WITH SINGLE CRYSTAL

CROSS REFERENCE TO RELATED APPLICATION

This application claims the priority of Korean Patent Application Nos. 10-2016-0072717 filed on Jun. 10, 2016 and 10-2016-0077956 filed on Jun. 22, 2016, in the Korean Intellectual Property Office, the disclosure of which is incorporated herein by reference.

BACKGROUND

1. Technical Field

The present disclosure relates to (K,Na)NbO$_3$ (hereinafter, "KNN") based ceramics, which is one of lead-free piezoelectric ceramics. More specifically, the present disclosure relates to KNN-based single crystal ceramics having a composition which can have its own single crystal growth in centimeter (cm) scale and improve the growth rate of the single crystal.

2. Description of the Related Art

Piezoelectric ceramic materials have excellent piezoelectric properties, and therefore have been widely used in applications such as transformers, actuators, transducers, sensors, resonators, and filters.

The most common piezoelectric ceramic materials include Pb(Zr, Ti)O$_3$ (hereafter, "PZT") based ceramics. However, despite the excellent piezoelectric properties of the PZT-based ceramics, the element Pb causes an environmental problem. Thus, a number of studies have been performed on Pb-free piezoelectric ceramics to replace PZT-based ceramics.

In particular, use regulations (RoHS) in electrical and electronic devices which contain hazardous substances, such as Pb, were stipulated in the European Union, and its use has been banned since July 2006. In the case of the PZT-based ceramics, however, no materials which can replace the PZT-based ceramics have yet been developed, and therefore its use has been allowed until the development of its replacement material.

Among the lead-free piezoelectric ceramics, (K,Na)NbO$_3$ (hereinafter, "KNN") based ceramics have received a lot of attention. This is because the KNN-based ceramics represents a lower piezoelectric constant (d$_{33}$) than the PZT-based ceramics, but has a similar or even higher piezoelectric voltage coefficient (g$_{33}$) required in a piezoelectric sensor compared to the PZT-based ceramics.

However, the KNN-based materials have a difficulty in commercialization due to low reproducibility of piezoelectric constant and piezoelectric characteristic suitable for a sensor in the industry. Therefore, the need for a technique for manufacturing a high quality single crystal material which shows a high piezoelectric voltage coefficient for a sensor has been emerged. However, the single crystal material has a high production cost. As a result, a novel technique for manufacturing a KNN-based single crystal by a low-cost manufacturing process for ceramics is required.

Typical KNN-based ceramics have a grain size of about 10 µm in sintered samples. Such grain size is not much different from the grain size of typical ceramics. The PZT also typically exhibits a similar grain size. For the PZT, when a single crystal grows using a crystalline seed by a solid phase sintering method, crystal growth is shown in centimeter scale after a longer sintering over 50 hours. In general, however, when a single crystal of KNN-based materials grows using a crystalline seed by a solid phase sintering method, it has been reported that even in the case of several times of hot pressing and long-time sintering for more than 50 hours, crystal grain growth is limited merely to less than 110 µm in size.

Such phenomenon may be caused by a sintering mechanism of the KNN-based material. With the KNN-based material, amorphous liquid phase of KNN-based components deficient of Na is formed due to volatilization of Na$_2$O during the course of sintering process. It has been also reported that, in some cases, the proportion of Na in this liquid phase exhibits much lower, specifically 10% lower compared to an original composition. That is, due to the formation of the liquid phase having severely insufficient Na, the grain growth in the KNN-based ceramics is limited.

In addition, it is difficult to manufacture a single-crystal seed in the KNN-based ceramics. A method for producing a KNN-based single-crystal seed includes a method of using a topo-chemical process, i.e., a method for producing a single-crystal seed by chemically substituting a Bi site with Na or K using a plate-like material of Bi—Nb—O series. However, this method also has difficulty to commercialize.

On the other hand, in the case of a method of using a molten salt, it is advantageous in commercialization since a single crystal seed can be produced in a relatively simple manner. With SrTiO$_3$, BaTiO$_3$, etc., the single crystal seed can be easily obtained using a molten salt by a heat treatment method. However, in the case of KNN-based ceramics, it was conventionally difficult to manufacture the single crystal seed by this method, since the single crystal growth itself was not well performed.

SUMMARY

It is one aspect of the present disclosure to provide a method for producing KNN-based single crystal ceramics, which can allow self-growth of a single crystal in centimeter scale through a compositional and process control in the KNN-based ceramics, and improve the single crystal growth rate and size.

Another aspect of the present disclosure is to provide KNN-based single crystal ceramics having a good piezoelectric property prepared by the above method.

Still another aspect of the present disclosure is to provide a method for producing a KNN-based single crystal ceramic seed by heat treatment using a liquid phase forming agent, such as molten salt, through a compositional control of the KNN-based ceramics.

The present disclosure is not limited to the above aspect and other aspects of the present disclosure will be clearly understood by those skilled in the art from the following description.

In accordance with one embodiment of the present disclosure, a method for producing (K,Na)NbO$_3$ (hereinafter, "KNN")-based single crystal ceramics includes mixing raw material powders comprising a K-containing compound, a Na-containing compound, an M-containing compound, and an Nb-containing compound to form a composition (K$_{0.5-x/2}$Na$_{0.5-x/2-y}$□$_{y/2}$M$_{x+y/2}$)Nb$_{1-x/3+y}$O$_3$ (hereinafter, "KNMN"), where M indicates a metal having a different valence from Na, and □ indicates a metal vacancy, that can adjust a metal vacancy occurred due to a lack of Na while compensating for a shortage of Na caused by its volatilization during sintering; subjecting to a calcination of the raw material powders; milling the calcined product; and sintering the milled product to allow a single crystal to grow.

According to some embodiments, the element M is preferably a divalent element, and more preferably includes one or more of Ba, Sr and Ca.

Further, the added quantity of the M-containing compound may be adjusted such that $0.01 \leq x \leq 0.02$, and $0.0 \leq y \leq 0.5$.

Further, in the step of milling the calcined product, the method further includes adding a Cu-containing compound to the calcined product, and subsequently subjecting to a milling. The growth of the singly crystal can be enhanced by promoting the formation of the liquid phase during the sintering process of KNMN through the addition of the Cu-containing compound. At this time, the Cu-containing compound includes CuO, and preferably the weight ratio of KNMN to CuO is 100 to z ($0 < z \leq 10.0$).

According to some embodiments, the liquid phase sintering may be carried out at 900 to 1175° C. for 0.5 TO 500 hours.

The KNN-based single crystal ceramics produced by the above proposed method may be greater than or equal to 0.1 cm in grain size.

The method for producing KNN-based single crystal ceramics according to the present disclosure is characterized by the following:

First, even though the raw material powders includes for example an M-containing compound having a different valence from Na, such as Sr and Ba, and so the proportion of Na is very low compared to the original composition in the liquid phase formed during the sintering, the stoichiometric composition is not significantly broken down by substituting some parts of Na$^+$ sites with the ions of the element M.

Further, as Na$^+$ ions are substituted with M$^{2+}$ ions in the KNN showing a crystal structure of perovskite (ABO$_3$, A: K, Na; B: Nb), metal vacancy may be generated at the position A, such that the grain growth of the KNN can be promoted.

The KNN-based single crystal ceramics according to the present disclosure in order to achieve another object are characterized by the following formula:

$(K_{0.5-x/2}Na_{0.5-x/2-y}\square_{y/2}M_{x+y/2})Nb_{1-x/3+y}O_3$, where M indicates a metal having a different valence from Na, and $\square$ indicates a metal vacancy.

According to some embodiments, the element M is preferably a divalent element, and more preferably includes one or more of Ba, Sr and Ca.

Further, it is preferred that $0.01 \leq x \leq 0.02$, and $0.0 \leq y \leq 0.5$.

In accordance with another object of the present disclosure, a method for producing a KNN-based single crystal seed includes: (a) mixing $(K_{0.5-x/2}Na_{0.5-x/2-y}\square_{y/2}M_{x+y/2})Nb_{1-x/3+y}O_3$ (where M indicates Ba, Sr or Ca, $\square$ indicates a metal vacancy, $0.01 \leq x \leq 0.02$, and $0.0 \leq y \leq 0.5$) (hereinafter, "KNMN") powder or $(1-x)(Na,K)NbO_{3-x}M(Cu_{1/3}Nb_{2/3})O_3$ (where $0.01 \leq x \leq 0.02$, and M indicates Ba, Sr or Ca) (hereinafter, "KNN-MCuN") powder, and liquid phase forming agent to form a mixture; (b) heat treating the mixture with a molten liquid phase forming agent to form a KNMN single crystal seed from the KNMN powder or the KNN-MCuN powder; and (c) cooling the product of step (b), and subsequently removing the liquid phase forming agent.

According to some embodiments, the KNMN powder or the KNN-MCuN powder may be a calcined powder.

Further, the liquid phase forming agent may be included in a range of 10 to 70% by weight of the total weight of the mixture.

Further, the liquid phase forming agent may be a water-soluble material. For example, the liquid phase forming agent may be alkaline salts. When the liquid phase forming agent is a water-soluble material, the removal of the liquid phase forming agent may be performed by dissolving the liquid phase forming agent cooled after the heat treatment into water.

Further, the heat treatment may be performed at 800 to 1150° C. for 0.5 to 500 hours.

The KNN-based single crystal ceramics according to the present disclosure has a composition of $(K_{0.5-x/2}Na_{0.5-x/2-y}\square_{y/2}M_{x+y/2})Nb_{1-x/3+y}O_3$, where M indicates Ba, Sr or Ca, and $\square$ indicates a metal vacancy. The composition is characterized by that a single crystal growth itself is possible by substituting a Na site with an element having a different valence from Na to compensate the site volatilized during the liquid phase sintering.

Conventionally, for the purpose of KNN single crystal growth, hot pressing was performed three times and then sintering was conducted using KTaO$_3$ (001) seed for about 50 hours to merely obtain a crystal of about 35 μm in size. Alternatively, in order to induce a large amount of liquid phase, although hot pressing was performed three times and then sintering was conducted for more than 50 hours, the crystal size was merely limited to 110 μm in size.

On the other hand, according to the present disclosure, due to a self-growth of the single crystal, pre-process such as hot pressing is not required, and KNN single crystal having a size of 1 cm or more can be obtained through a sintering for about 2 hours even without using a seed.

Further, according to the present disclosure, the Cu-containing compound may be added during the milling process after calcination. The amount of liquid phase increases with the addition of the Cu-containing compound. Upon forming the liquid phase, the liquid phase may easily be formed due to the component Cu, such that the liquid phase forming rate, ultimately the single crystal growth rate can be increased.

In addition, according to the method for producing a KNN-based single crystal seed, the KNN-based single crystal seed can easily be produced by a heat treatment method using a liquid phase forming agent by use of KNMN powder having a composition well-performing a single crystal growth through the substitution of Na site that is volatilized during the heat treatment with an element having a different valence from Na. The KNN-based single crystal seed as produced can be used to the manufacture of KNN-based crystalline orientation material using RTGG (Reactive Templated Grain Growth) method or TGG (Templated Grain Growth) method, and to the manufacture of KNN-based single crystal using SSCG (Solid-State Single Crystal Growth) method.

DETAILED DESCRIPTION

Hereinafter, embodiments of the present disclosure will be described in detail with reference to the accompanying drawings. It should be understood that the present disclosure is not limited to the following embodiments, and that the embodiments are provided for illustrative purposes only. The scope of the disclosure should be defined only by the accompanying claims and equivalents thereof.

For a better understanding of this disclosure, it will now be described in detail, in connection with (K,Na)NbO$_3$ (hereinafter, "KNN")-based single crystal ceramics in accordance with the present disclosure, with reference to the accompanying drawings.

Figure 1:
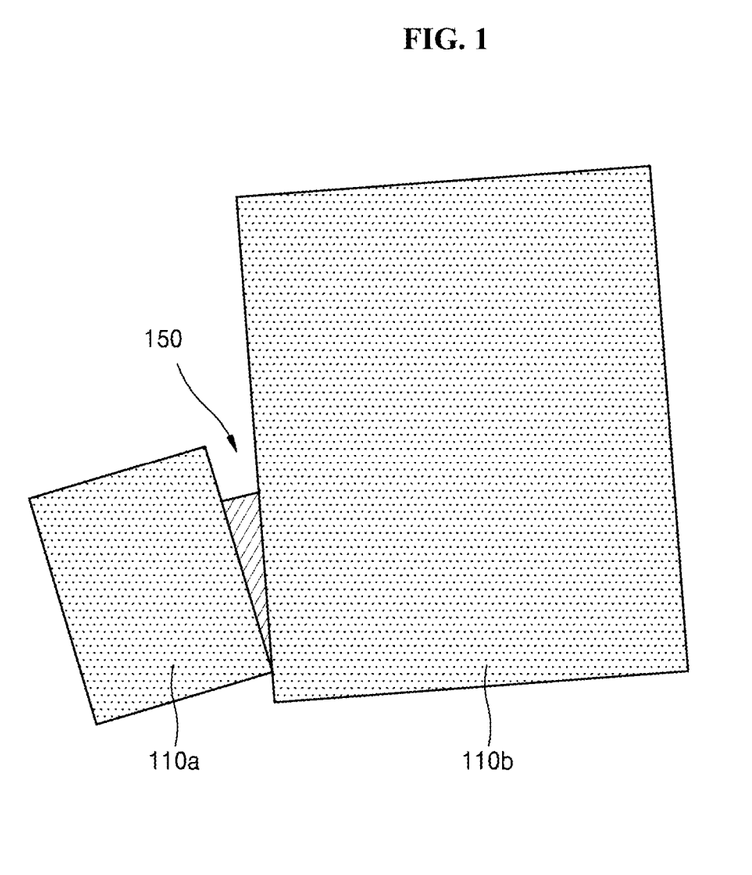
FIGS. 1 and 2 schematically show a grain growth process during the sintering of normal KNN-based ceramics, respectively.
Figure 2:
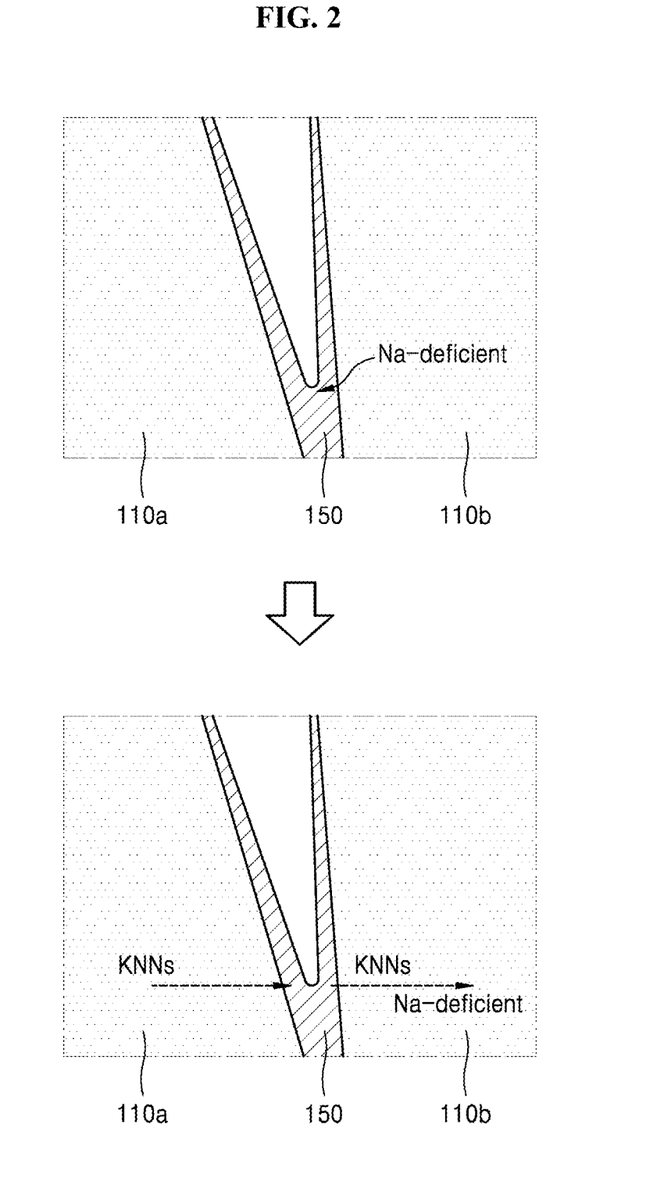

FIGS. 1 and 2 schematically show a grain growth process of KNN-based ceramics by a normal liquid phase sintering, respectively.

With the KNN-based ceramics, the volatilization of Na$_2$O forms a liquid phase 150. At the interface between a relatively small grain KNN-based ceramic 110a and a relatively large grain KNN-based ceramic 110b adjacent to each other, the large grain KNN-based ceramic 110b crystallographically grows due to such liquid phase 150, with the small grain KNN-based ceramic 110a components moving toward the large grain KNN-based ceramic 110b through the liquid phase.

As can be seen from FIG. 2, however, the liquid phase 150 is generated due to the vaporization of Na$_2$O, and so the liquid phase 150 is deficient of Na. As an example, once Na is too low such as 10% or less relative to the original composition, the crystal growth is limited due to the lack of Na in the large grain KNN-based ceramic 110b. Therefore, growing to a single crystal in centimeter scale is impossible.

Thus, the inventors have made a long study and found that if Na site which would become vacancy due to its volatilization during the sintering of the liquid phase is replaced with an element having a different valence, the crystal growth can be made due to the occurrence of the metal vacancies inside the growing grain, together with the compensation of Na ions, and further the addition of Cu-containing compound can promote the formation of the liquid phase to help the single crystal growth.

Figure 3:
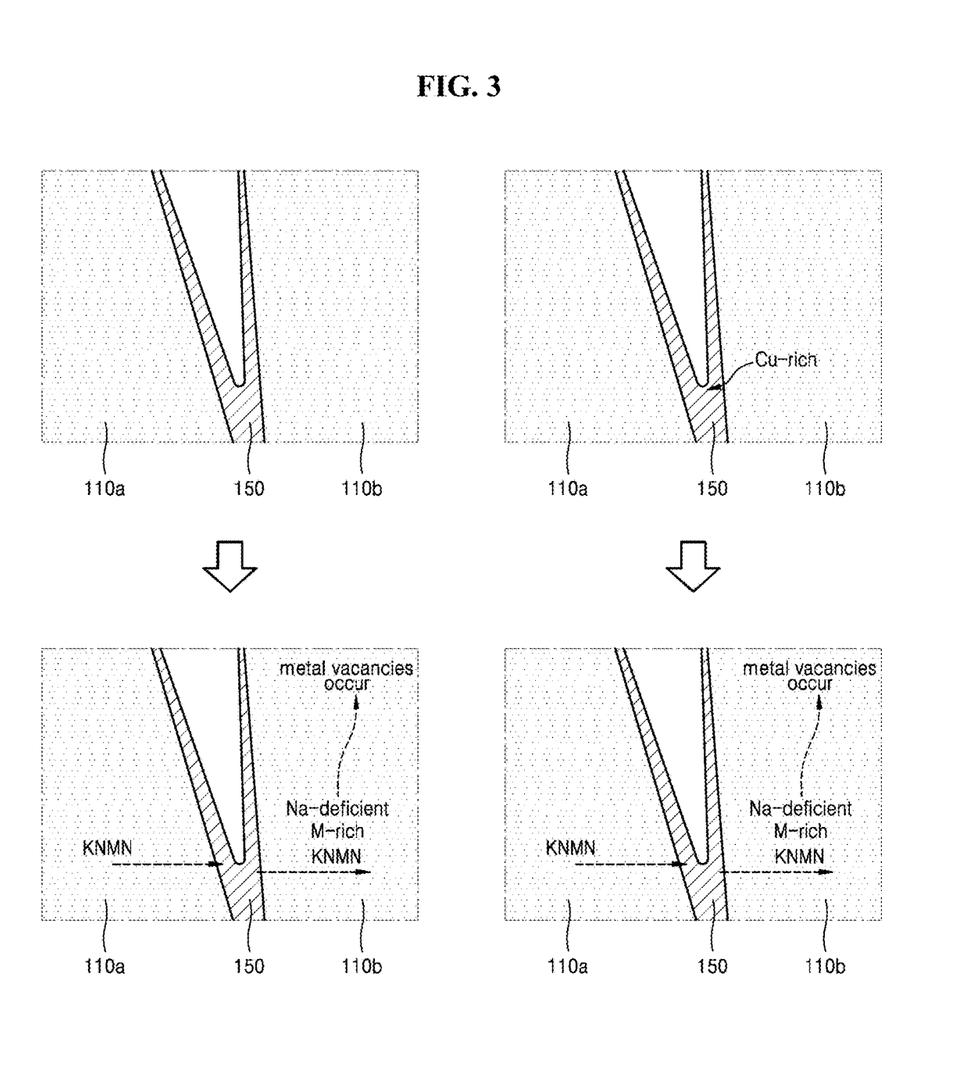
FIG. 3 schematically shows a single-crystal growth process of KNN-based ceramics, i.e., KNMN ceramics, according to the present disclosure.

FIG. 3 schematically shows a single-crystal growth process in the KNN-based ceramics by the compensation of Na ions and the generation of metal vacancies according to the present disclosure.

Referring to FIG. 3, with the crystal growth process in the KNMN ceramics by the liquid phase sintering according to the present disclosure, the volatilization of Na$_2$O forms a liquid phase 150, as shown in FIG. 1. At the interface between a relatively small gran KNMN-based ceramic 110a and a relatively large grain KNMN-based ceramic 110b adjacent to each other, the large grain KNMN-based ceramic 110b crystallographically grows due to such liquid phase 150, with the small grain KNMN-based ceramic 110a components moving toward the large grain KNMN-based ceramic 110b through the liquid phase 150.

However, in the case of FIG. 3, due to the addition of M ions, the volatilization of Na is compensated in the growing grain, while metal vacancies are formed as $M^{2+}$ ions are substituted for $Na^+$ ions. Thus, the single crystal growth can be made in more than 0.1 centimeter scale. A Cu-containing compound such as CuO can be added to promote the formation of the liquid phase.

Applying the above principle, the method for producing KNN-based single crystal ceramics according to the present disclosure will be described as below.

Figure 4A:
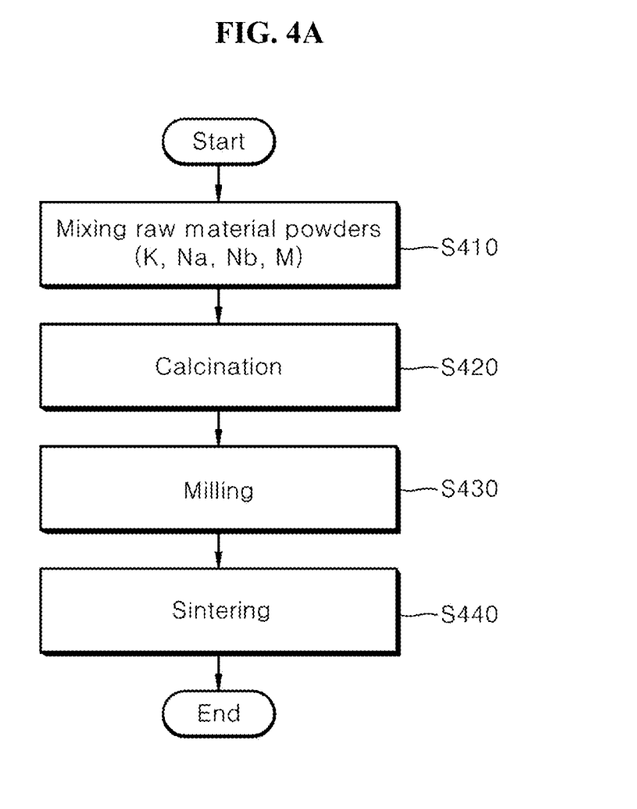
FIG. 4A is a schematic flow diagram illustrating a method for producing a KNN-based single crystal ceramic according to an embodiment of the present disclosure.

FIG. 4A is a schematic flow diagram illustrating a method for producing KNN-based single crystal ceramics according to an embodiment of the present disclosure.

Referring to FIG. 4A, the depicted method for producing KNN-based single crystal ceramics includes the step of mixing raw material powders (S410), the step of calcination (S420), the step of milling (S430), and the step of sintering (S440).

First, in the step of mixing raw material powders (S410), the raw material powders comprising a K-containing compound, a Na-containing compound, an M-containing compound, and an Nb-containing compound are mixed to prepare KNMN single crystal ceramics. The mixing may be carried out by a milling method with grinding, but not limited thereto.

The K-containing compound may include for example K$_2$CO$_3$, the Na-containing compound may include for example Na$_2$CO$_3$, the M-containing compound may include for example MCO$_3$, such as BaCO$_3$, and the Nb-containing compound may include for example Nb$_2$O$_5$. In addition to the above listed compounds, other materials for the K-containing compound, Na-containing compound, and Nb-containing compound may be used as needed. The element M may be an element having a different valence from Na, preferably a divalent element, and more preferably may include at least one of Ba, Sr and Ca. In the experimental example of the present disclosure, Ba was used.

Further, the raw material powders can for example be weighed and added to satisfy the following composition:

$(K_{0.5-x/2}Na_{0.5-x/2-y}\square_{y/2}M_{x+y/2})Nb_{1-x/3+}O_3$+z wt. % CuO

In the formula, it is preferable that $0.01 \le x \le 0.02$, $0.0 \le y \le 0.5$, and $0.0 \le z \le 10.0$. If x and y are less than these ranges, it is difficult for M to compensate for the volatilization of Na, and difficult to obtain a sufficient size of the single crystal accordingly. On the contrary, if x and y are greater than these ranges, the piezoelectric characteristics may be degraded due to the addition of an excessive M.

Then, in the calcination step (S420), the mixed raw material powders are calcined to form a first KNMN ceramic.

The calcination may be for example carried out at 700 to 950° C. at approximately 0.5 to 20 hours.

Then, in the milling step (S430), the calcined product may be milled, i.e., grinded, to perform a particle atomization.

Figure 4B:
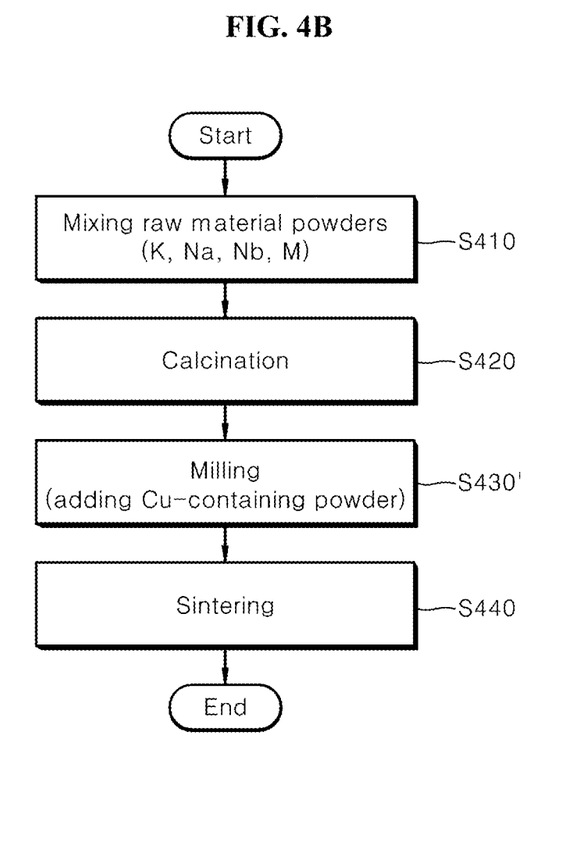
FIG. 4B is a schematic flow diagram illustrating a method for producing a KNN-based single crystal ceramic according to another embodiment of the present disclosure.

Further, as shown in FIG. 4B, the milling step may be carried out with the addition of Cu-containing compound (S430'). The Cu-containing compound such as CuO acts to promote forming liquid phase in the sintering step to be described later.

The Cu-containing compound may be for example CuO. Loading of the Cu-containing compound is preferably $0.0 \leq z \leq 10.0$. If Cu is added excessively out of the above range, CuO may be reacted with other materials during sintering, resulting in excessive melting, but rather may disturb the single crystal growth.

The milling may be for example carried out at 10 to 350 rpm for 0.5 to 48 hours.

After milling, a molding process of forming a predetermined shape may be further conducted, if necessary. The molding can be performed by known methods such as method of pressing at a pressure of approximately 100 MPa.

Then, in the sintering step (S440), the milled product may be sintered to allow the single crystal to grow.

As described above, according to the present disclosure, due to the addition of M ions, the volatilization of Na is compensated in the growing grain, while metal vacancies are formed as $M^{2+}$ ions are substituted for $Na^+$ ions. Thus, the single crystal growth can be made in more than 0.1 centimeter scale.

In addition, the sintering of the liquid phase may preferably be carried out at 900 to 1175° C. for 0.5 to 500 hours. If the sintering temperature is below 900° C., the sintering is not performed, whereas if the sintering temperature exceeds 1175° C., the prepared piezoelectric materials may be melted. Further, if the sintering time is less than 0.5 hour, the single crystal size as formed may be restrictive, whereas if the sintering time is greater than 500 hours, a dielectric loss may be high due to excessive volatilization of Na.

The KNN-based single crystal ceramics produced by the above proposed method may be greater than or equal to 0.1 cm in grain size. Conventionally, for the purpose of KNN single crystal growth, hot pressing was performed three times and then sintering was conducted using $KTaO_3$ (001) seed for about 50 hours, merely obtaining a crystal of about 35 μm in size. However, according to the present disclosure, the KNN single crystal ceramic having a large size as described above can be obtained only by the compositional design for the raw material powders to produce KNN ceramics and sintering for approximately 2 hours, without particular pre-process such as hot pressing or using a seed.

According to some embodiments, the KNN-based single crystal ceramics according to the present disclosure can have the composition $(K_{0.5-x/2}Na_{0.5-x/2-y}\square_{y/2}M_{x+y/2})Nb_{1-x/3+y}O_3$.

In the formula, $0.01 \leq x \leq 0.02$, $0.0 \leq y \leq 0.5$, M indicates a metal having a different valence from Na, and preferably a divalent element, and more preferably includes one or more of Ba, Sr and Ca.

According to some embodiments, at least one of K, Na and Nb may be substituted with other elements. For example, at least one of K or Na may be substituted with Li, and Nb may be substituted with Ta, Sb, etc. However, the metal vacancy ($\square$) may be formed due to the element M.

Figure 7:
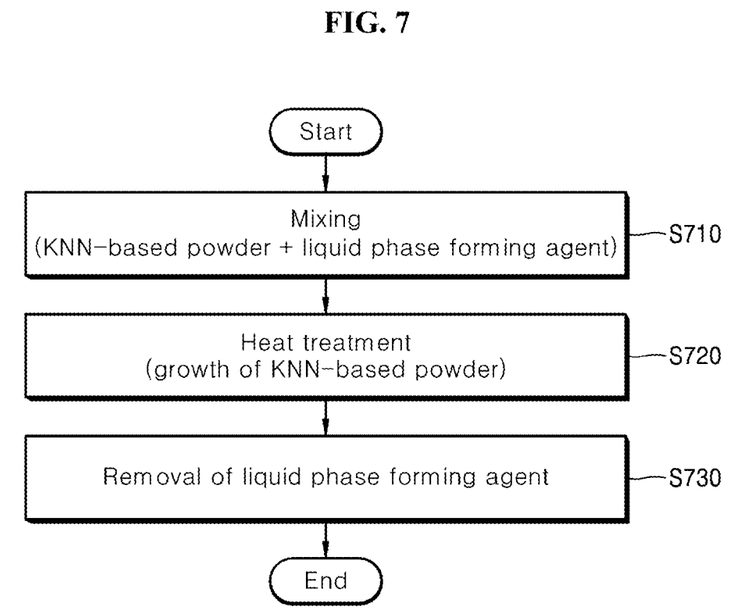
FIG. 7 is a schematic flow diagram showing a method for producing a KNN-based single crystal seed according to another embodiment of the present disclosure.

FIG. 7 is a schematic flow diagram showing a method for producing a KNN-based single crystal seed according to another embodiment of the present disclosure.

Referring to FIG. 7, the method for producing a KNN-based single crystal seed includes the step of mixing (S710), the step of heat treatment (S720), and the step of removing a liquid phase forming agent (S730).

First, in the step of mixing (S710), a KNN-based powder and a liquid phase forming agent are mixed. As used herein, the mixing of the KNN-based powder and the liquid phase forming agent includes a complete mixing of the KNN-based powder and the liquid phase forming agent, as well as displacing the liquid phase forming agent over or under a layer of the KNN-based powder. Thus, the mixture may include a complete mixture of the KNN-based powder and the liquid phase forming agent or a mixture which forms a layer of the KNN-based powder on or under which the liquid phase forming agent is displaced.

According to some embodiments, the KNN-based powder includes $(K_{0.5-x/2}Na_{0.5-x/2-y}\square_{y/2}M_{x+y/2})Nb_{1-x/3+y}O_3$ (wherein M indicates Ba, Sr or Ca, $\square$ indicates a metal vacancy, $0.01 \leq x \leq 0.02$, and $0.0 \leq y \leq 0.5$) (hereinafter, "KNMN") powder or $(1-x)(Na,K)NbO_3-xM(Cu_{1/3}Nb_{2/3})O_3$ (wherein $0.01 \leq x \leq 0.02$, M indicates Ba, Sr or Ca) (hereinafter, "KNN-MCuN") powder.

In the formula of the KNMN composition, if x and y are less than these ranges, it is difficult for M to compensate for the volatilization of Na, and difficult to obtain a sufficient size of the single crystal accordingly. On the contrary, if x and y are greater than these ranges, the piezoelectric characteristics may be degraded due to the occurrence of a secondary phase caused by the excessive addition of M.

The inventors have made a long study and found that if Na site which would become vacancy due to its volatilization from the liquid phase is replaced with an element having a different valence, such as Ca or Ba, the crystal growth can be made due to the occurrence of the metal vacancies inside the growing crystal grain, together with the compensation of the volatilized Na ions, and as a result, with respect to the related composition, the KNMN or KNN-MCuN composition as given above can be provided.

For example, for the KNMN, the volatilization of Na is compensated in the growing grain due to the addition of M ions, and the metal vacancies are formed as $M^{2+}$ ions are substituted for $Na^+$ ions, and thus the single crystal growth is possible. For the KNN-MCuN, for the rapid growth of the seed and the crystal grains, together with the element M, Cu compound such as CuO can be added which can promote the formation of the liquid phase between or inside the primary particles of the aggregated KNN-MCuN powder.

Such KNN-based powder may be a calcined powder or a completely sintered powder, but considering the presence of the heat treatment step (S720) to be described later, the KNN powder may be a calcined powder prior to sintering. For the KNMN calcined powder, it can be made through the step of mixing raw material powders and the step of calcination in the above described method for producing KNMN single crystal ceramics. Further, the KNN-MCuN powder can be produced by a method including mixing raw material powders comprising a K-containing compound, a Na-containing compound, an M-containing compound, a Cu-containing compound, and an Nb-containing compound through milling, etc., to have a composition KNN-MCuN, and calcining the mixed raw material powders.

According to some embodiments with respect to the KNN-based ceramic, at least one of K, Na and Nb may be substituted with other elements. For example, at least one of K or Na may be substituted with Li, and Nb may be substituted with Ta, Sb, etc. However, according to some embodiments with respect to the KNMN, the metal vacancies $\square$ are originated from the element M and formed during the heat treatment to be described later. Also in the KNN-MCuN, the metal vacancies $\square$ are originated from the element M and formed during the heat treatment.

The liquid phase forming agent is a material capable of forming a liquid phase by melt in the heat treatment step (S720) to be described later.

Such liquid phase forming agent may be a water soluble material. For example, the liquid phase forming agent may be an alkaline salt such as KF, KCl, etc. As such, when the liquid phase forming agent is a water soluble material, the removal of the liquid phase forming agent may be carried out by dissolving into water the liquid phase forming agent cooled after the heat treatment. Further, when the liquid phase forming agent is an alkaline salt, the liquid phase can easily be formed at a temperature more than 800° C. or 900° C., which is more suitable for the present disclosure.

According to some embodiments, the liquid phase forming agent may be included in a range of 10 to 70% by weight of the total weight of the mixture. If the content of the liquid phase forming agent is less than 10% by weight, the liquid phase as formed may be insufficient to form a seed of a large enough size in the heat treatment process. On the contrary, if the liquid phase forming agent exceeds 70% by weight of the total weight of the mixture, the content of KNN-based powder in the mixture may be relatively decreased, thereby decreasing the productivity.

Then, in the heat treatment step (S720), the mixture is heat treated to form a KNMN single crystal seed from the KNMN powder with the aid of the molten liquid phase forming agent.

By means of the melting of such liquid phase forming agent, the single crystal growth of the KNN-based ceramics can be made depending on the movement of KNN-based components through the liquid phase generated between the KNN-based ceramics adjacent to each other, and, as a result, the KNN-based single crystal seeds can be formed.

The heat treatment may be performed at a temperature of 800 to 1150° C. for 0.5 to 500 hours. If the heat treatment temperature is less than 800° C. or the heat treatment time is less than 0.5 hours, forming the liquid phase from the liquid phase forming agent becomes difficult and the crystal growth may also not be made well. On the contrary, if the heat treatment temperature exceeds 1150° C. or the heat treatment time exceeds 500 hours, the grain growth may not be achieved sufficiently compared to the increased energy required for the heat treatment, as well as the piezoelectric characteristics may significantly be lowered due to the excessive volatilization of Na.

Then, in the step of removing the liquid phase forming agent (S730), the heat treated product is cooled, and then the liquid phase forming agent is removed.

The Removal of the liquid phase forming agent may be performed by the selective reaction with only the liquid phase forming agent. For example, if the liquid phase forming agent is a water-soluble, such as alkaline salts, it may be performed by method of washing the heat-treated product with water, wherein the water soluble liquid phase forming agent only can selectively be dissolved into water and then removed.

As described above, the KNN-based single crystal seed can easily be produced by a heat treatment method with the aid of the liquid phase forming agent by using a KNN-based material having a composition KNMN with which a single crystal growth occurs well.

EXAMPLES

Hereinafter, the present disclosure will be described in more detail with use of preferred examples of the present disclosure. However, it should be noted that while the preferred examples are listed for easy understanding of the contents of the present disclosure, the present disclosure is not limited to these examples.

Details apparent to those skilled in the art are omitted here since they can technically be inferred from the following reading of the present disclosure by those skilled in the art.

Example 1

(1) Preparation of Sample

KNMN ceramic sample having a final composition $(K_{0.5-0.015/2}Na_{0.5-0.015/2-0.1}\square_{0.1/2}Ba_{0.015+0.1/2})Nb_{1-0.015/3+0.1}O_3$ was synthesized from oxides having a purity of 99% or more. $K_2CO_3$, $Na_2CO_3$, $Nb_2O_5$, and $BaCO_3$ powders were mixed in a polypropylene jar with zirconia balls for 12 hours. Then, the mixture was dried and calcined for 3 hours at 900° C. To the calcined powder CuO was added, and then milled for 24 hours, and then sintered at various sintering temperatures in the range of 1070 to 1125° C.

(2) Microstructure and Evaluation

Figure 5:
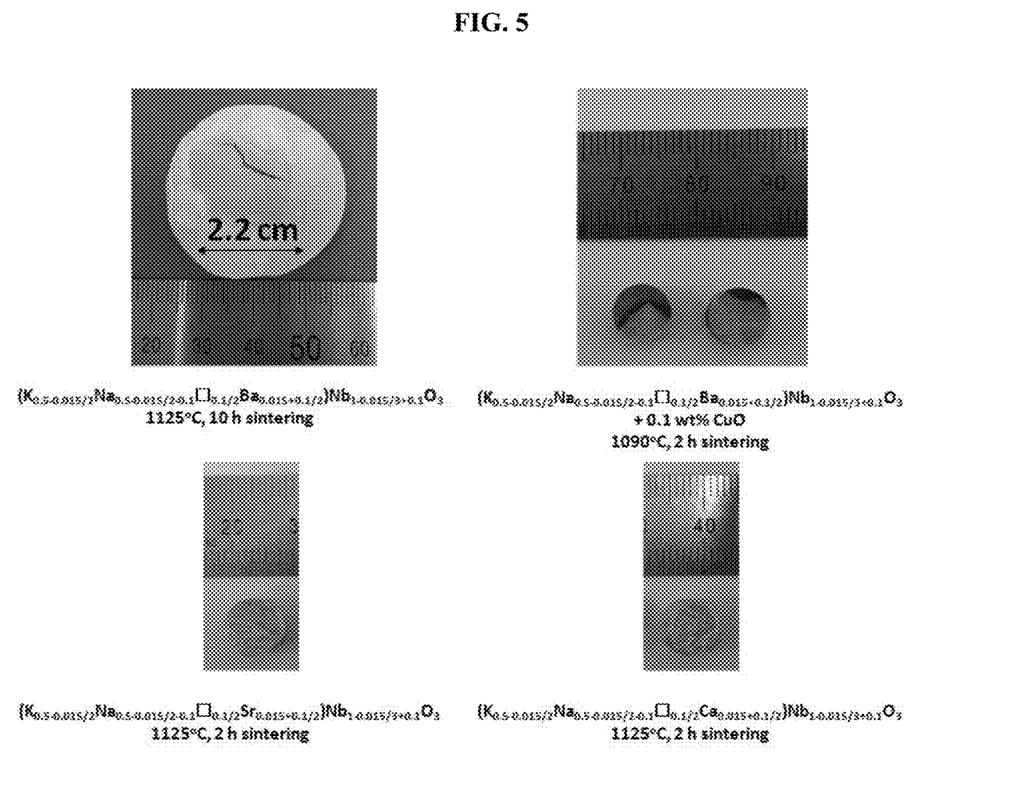
FIG. 5 shows photographs for the single crystal growth of KNMN and KNMN+CuO samples according to Example 1.

FIG. 5 shows photographs illustrating the size of the single crystal portions in the KNMN ceramics depending on the sintering temperature according to Example 1. Referring to FIG. 5, it can be seen that the single crystal has been grown more than 2 cm in size at 10 hours sintering.

Figure 6:
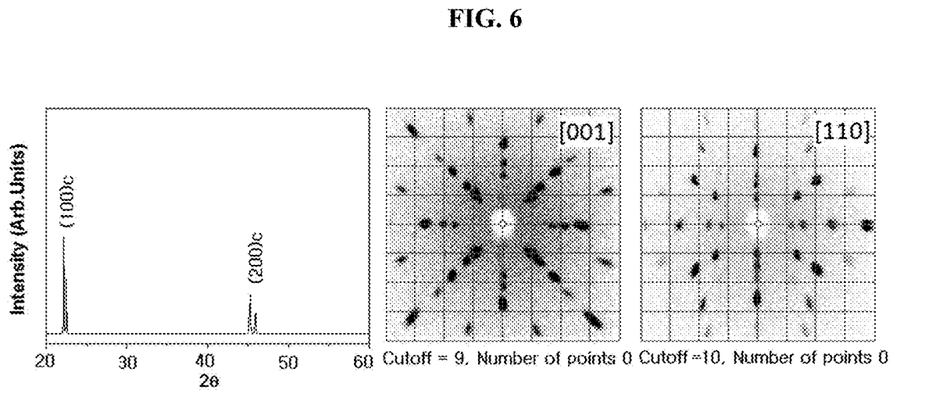
FIG. 6 shows an X-ray diffraction pattern and Laue images for KNMN+CuO sample sintered at 1120° C. for 10 hours in Example 1.

FIG. 6 shows an X-ray diffraction pattern and Laue images for KNMN+CuO sample sintered at 1120° C. for 10 hours according to Example 1. Referring to FIG. 6, the crystal grains as grown by the method presented can be found to be a single crystal.

For the dielectric characteristics and the piezoelectric voltage coefficient measurements, the samples were polled by the appliance of DC field of 1 kV/mm for 30 minutes in silicone oil at 120° C. All electrical measurements were carried out after aging the samples for 24 hours. The piezoelectric and dielectric properties were measured using a piezo $d_{33}$ meter (Micro-Epsilon Channel Product DT-3300) and an impedance analyzer (4294A, Agilent Technologies, Santa Clara, Calif., USA).

For a single crystal portion of the sample KNMN+CuO, it showed a more excellent piezoelectric voltage coefficient ($g_{33}$) of more than 100 [$10^{-3}$ Vm/N], and showed a high value of $d_{33} \times g_{33}$ indicating an energy harvesting characteristic of 20,000 [$10^{-15}$ m$^2$/N]. Further, the single crystal portion of the sample KNMN+CuO showed a very high phase transition temperature of more than 390° C., which is advantageous in that the temperature range which allows the portion to melt can be very high.

Example 2

(1) Preparation of Sample

KNMN powder (where KNMN is $K_{0.4925}Na_{0.4925-x}\square_{x/2}Ba_{0.015+x/2})Nb_{0.995+x}O_3$) calcined for 3 hours at 900° C. was used as a KNN-based powder, and KF was used as a liquid phase forming agent.

70% by weight of KNMN powder and 30% by weight of KF were mixed, and then heat-treated at 1080° C. for 8 hours, followed by natural cooling to room temperature. Then, the resultant was washed with a distilled water to remove the KF by allowing the KF to be dissolved in the distilled water.

(2) Confirmation of Microstructure and Crystal Structure

Figure 8:
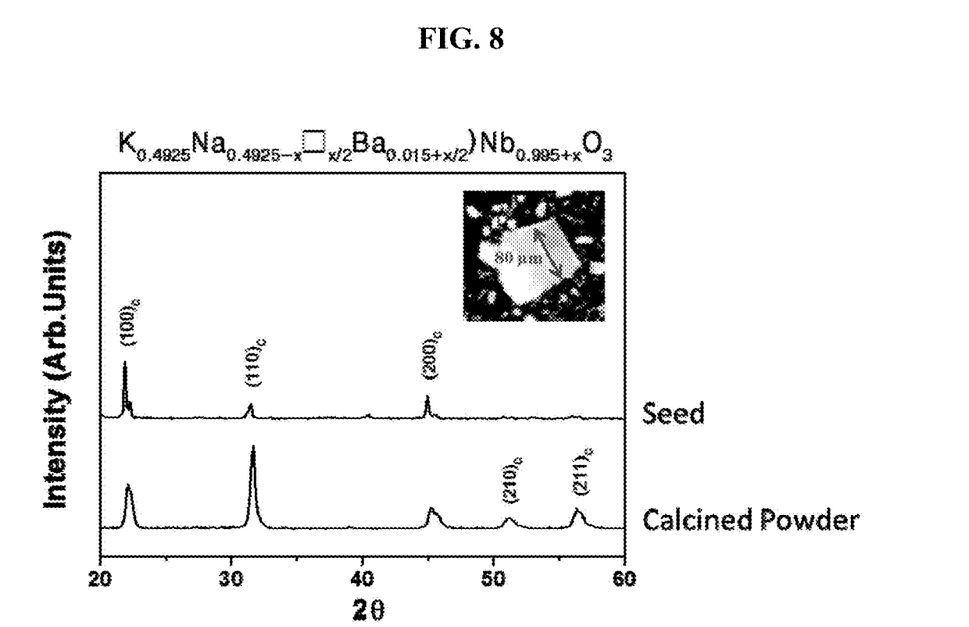
FIG. 8 shows an X-ray diffraction analysis result and optical micrograph of a single crystal seed and a calcined KNMN powder produced according to Example 2.

FIG. 8 shows an X-ray diffraction analysis and optical micrograph of the single crystal seed and the calcined KNMN powder produced according to Example 2.

Referring to FIG. 8, with the single crystal seed as produced, it can be seen that the KNMN single crystal seed having a size of about 80 μm was well prepared.

Further, the X-ray diffraction analysis in FIG. 8 indicates that the KNMN single crystal seed was grown in [001] direction.

Example 3

(1) Preparation of Sample 0.985KNN-0.015MCuN (where MCuN indicates $Ca(Cu_{1/3}Nb_{2/3})O_3$) powder calcined for 3 hours at 900° C. was used as a KNN-based powder, and KF was used as a liquid phase forming agent.

70% by weight of KNN-MCuN powder and 30% by weight of KF were mixed, and then heat-treated at 1080° C. for 8 hours, followed by natural cooling to room temperature. Then, the resultant was washed with a distilled water to remove the KF by allowing the KF to be dissolved in the distilled water.

(2) Confirmation of Microstructure

Figure 9:
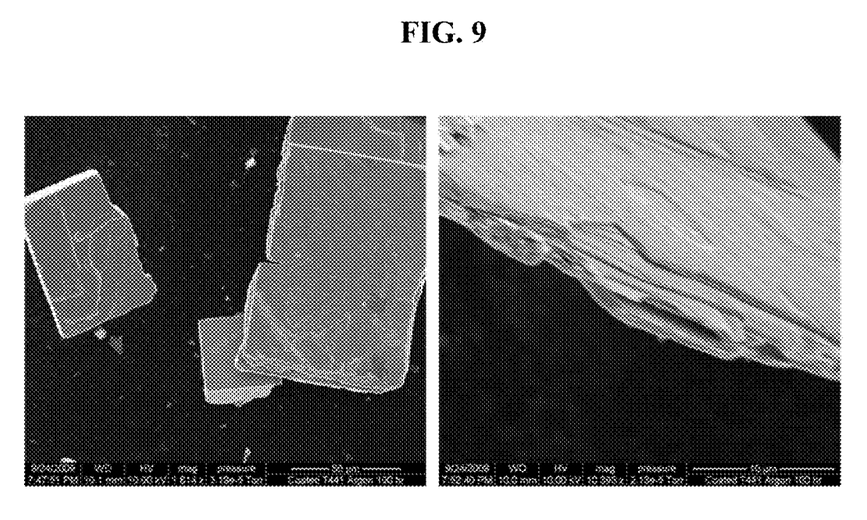
FIG. 9 shows SEM images of KNN-MCuN single crystal seed produced according to Example 3.

FIG. 9 shows SEM images of the KNN-MCuN single crystal seed produced according to Example 3.

Referring to FIG. 9, it can be seen that the KNN-MCuN single crystal seed having a length of more than about 50 μm was well prepared.

Example 4

(1) Preparation of Sample 0.985KNN-0.015MCuN (where MCuN indicates $Ca(Cu_{1/3}Nb_{2/3})O_3$) powder calcined for 3 hours at 900° C. was used as a KNN-based powder, and KCl was used as a liquid phase forming agent.

70% by weight of KNN-MCuN powder and 30% by weight of KCl were mixed, and then heat-treated at 1080° C. for 8 hours, followed by natural cooling to room temperature. Then, the resultant was washed with a distilled water to remove the KCl by allowing the KCl to be dissolved in the distilled water.

(2) Confirmation of Microstructure

Figure 10:
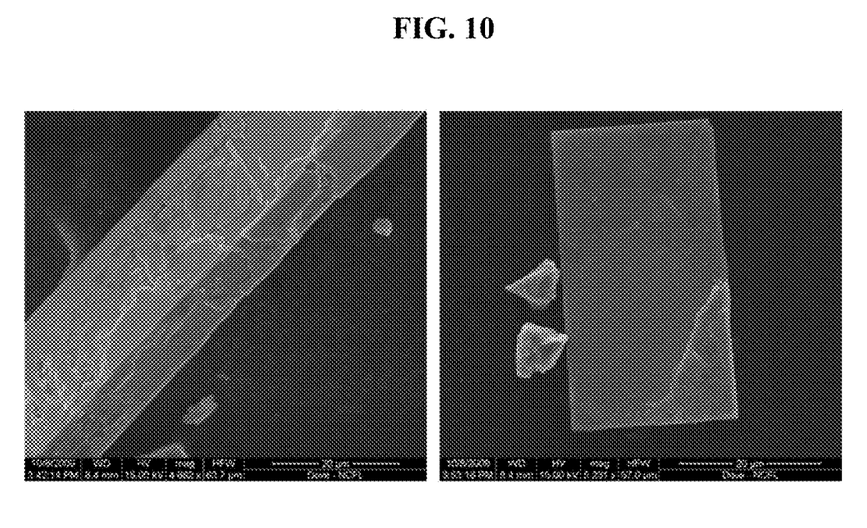
FIG. 10 shows SEM images of KNN-MCuN single crystal seed produced according to Example 4.

FIG. 10 shows SEM images of the KNN-MCuN single crystal seed produced according to Example 4.

Referring to FIG. 10, it can be seen that the KNN-MCuN single crystal seed having a length of more than about 50 μm was well prepared.

While the preferred examples of the invention have been shown and described for illustrative purpose only, it should be understood that various substitutions, modifications and variations may be made by those skilled in the art without departing from the spirit or scope of the invention. Accordingly, all such modifications and variations are included in the scope of the invention as defined by the following claims.

What is claimed is:

1. A KNN-based single crystal ceramic represented by the following formula:

$(K_{0.5-x/2}Na_{0.5-x/2-y}\square_{y/2}M_{x+y/2})Nb_{1-x/3+y}O_3$, wherein M indicates a metal having a different valence from Na, □ indicates a metal vacancy, 0.01≤x≤0.02, and 0.0≤y≤0.5, and wherein the KNN-based single crystal ceramic has a grain size of 0.1 cm or more.

2. The KNN-based single crystal ceramic of claim 1, wherein the element M is a divalent element.

3. The KNN-based single crystal ceramic of claim 1, wherein the element M comprises at least one of Ba, Sr or Ca.

4. The KNN-based single crystal ceramic of claim 1, wherein at least one of K, Na, and Nb is substituted with other element, and the metal vacancy is formed due to the element M.

5. The KNN-based single crystal ceramic of claim 1, wherein the KNN-based single crystal ceramic is produced by:

preparing a raw material mixture comprising a K-containing compound, a Na-containing compound, an M-containing compound, and an Nb-containing compound;

subjecting the raw material mixture to a calcination to form a calcined product;

milling the calcined product to form a milled product, wherein milling the calcined product comprises adding a Cu-containing compound to the calcined product; and sintering the milled product.

6. The KNN-based single crystal ceramic of claim 1, wherein a single crystal portion of the KNN-based single crystal ceramic has a piezoelectric voltage coefficient ($g_{33}$) of 100 [$10^{-3}$ Vm/N] or more.

* * * * *